United States Patent
Yang et al.

(10) Patent No.: US 9,613,900 B2
(45) Date of Patent: Apr. 4, 2017

(54) NANOSCALE INTERCONNECT STRUCTURE (71) Applicant: International Business Machines Corporation, Armonk, NY (US)

(72) Inventors: Chih-Chao Yang, Glenmont, NY (US); Stephan A. Cohen, Wappingers Falls, NY (US); Eric G. Liniger, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/012,492

(22) Filed: Feb. 1, 2016

(65) Prior Publication Data

US 2016/0148867 A1 May 26, 2016

Related U.S. Application Data

(62) Division of application No. 14/176,228, filed on Feb. 10, 2014, now Pat. No. 9,281,211.

(51) Int. Cl.
*H01L 23/48* (2006.01)
*H01L 23/52* (2006.01)
(Continued)

(52) U.S. Cl.
CPC ...... *H01L 23/528* (2013.01); *H01L 21/31111* (2013.01); *H01L 21/7682* (2013.01);
(Continued)

(58) Field of Classification Search
CPC .......... H01L 27/14636; H01L 2224/18; H01L 21/768; H01L 21/76898; H01L 23/28; H01L 23/495; H01L 24/01; H01L 24/18; H01L 2224/01; H01L 23/53238; H01L 21/76808; H01L 21/76849; H01L 21/76834; H01L 23/5329; H01L 23/5226; H01L 23/53295
(Continued)

(56) References Cited

U.S. PATENT DOCUMENTS

4,888,087 A 12/1989 Moslehi et al.
5,070,388 A 12/1991 Wade et al.
(Continued)

*Primary Examiner* — Thao X. Le
*Assistant Examiner* — Nduka Ojeh
(74) *Attorney, Agent, or Firm* — Scully, Scott, Murphy & Presser, P.C.; Louis J. Percello, Esq.

(57) ABSTRACT

An interconnect structure includes a first dielectric material having an undercut region located at an upper surface thereof. A first conductive structure is located above a first area of the undercut region. The first conductive structure comprises a first conductive metal portion having a diffusion barrier portion located on one sidewall surface of the first conductive metal portion and having a metal liner located on another sidewall surface and a bottom surface of the first conductive metal portion. A second conductive structure is located above a second area of the undercut region. The second conductive structure comprises a second conductive material portion having a diffusion barrier portion located on one sidewall surface of the second conductive material portion and having a metal liner located on another sidewall surface and a bottom surface of the second conductive metal portion. A gap is located between the first and second conductive structures.

15 Claims, 5 Drawing Sheets

(51) Int. Cl.
*H01L 29/40* (2006.01)
*H01L 23/528* (2006.01)
*H01L 23/532* (2006.01)
*H01L 21/768* (2006.01)
*H01L 21/311* (2006.01)

(52) U.S. Cl.
CPC .. *H01L 21/76802* (2013.01); *H01L 21/76843* (2013.01); *H01L 21/76844* (2013.01); *H01L 21/76852* (2013.01); *H01L 21/76879* (2013.01); *H01L 21/76885* (2013.01); *H01L 23/53209* (2013.01); *H01L 23/53223* (2013.01); *H01L 23/53238* (2013.01); *H01L 23/53266* (2013.01); *H01L 23/53252* (2013.01); *H01L 2924/0002* (2013.01)

(58) Field of Classification Search
USPC .......... 257/E21.855, 774, E23.145, E21.575, 257/E21.576–E21.581, 758; 438/396, 438/637, 643, 622, 618, 623, 687, 421, 438/424
See application file for complete search history.

(56) References Cited

U.S. PATENT DOCUMENTS

| | | |
|---|---|---|
| 5,354,712 A | 10/1994 | Ho et al. |
| 5,585,673 A | 12/1996 | Joshi et al. |
| 5,695,810 A | 12/1997 | Dubin et al. |
| 5,976,970 A | 11/1999 | Dalal et al. |
| 6,323,554 B1 | 11/2001 | Joshi et al. |
| 6,342,733 B1 | 1/2002 | Hu et al. |
| 6,433,429 B1 | 8/2002 | Stamper |
| 6,706,625 B1 | 3/2004 | Sudijono et al. |
| 7,553,760 B2 | 6/2009 | Yang et al. |
| 7,709,965 B2 | 5/2010 | Kim |
| 8,367,538 B2 | 2/2013 | Lee |
| 8,420,530 B2 | 4/2013 | Thet et al. |
| 2002/0163058 A1 | 11/2002 | Chen et al. |
| 2004/0113279 A1 | 6/2004 | Chen et al. |
| 2004/0130027 A1* | 7/2004 | Chen ............... H01L 23/5222 257/758 |
| 2005/0184397 A1* | 8/2005 | Gates ............... H01L 21/76801 257/774 |
| 2006/0046407 A1 | 3/2006 | Juengling |
| 2007/0120263 A1* | 5/2007 | Gabric ............. H01L 21/7682 257/762 |
| 2010/0038782 A1* | 2/2010 | Yang .............. H01L 21/76843 257/751 |
| 2010/0314764 A1 | 12/2010 | Yang et al. |
| 2012/0146127 A1 | 6/2012 | Lee et al. |
| 2012/0280398 A1* | 11/2012 | Clevenger ........ H01L 21/7682 257/770 |
| 2012/0292602 A1* | 11/2012 | Guo ............... H01L 29/66515 257/40 |

* cited by examiner

NANOSCALE INTERCONNECT STRUCTURE

BACKGROUND

The present application relates to a semiconductor structure and a method of forming the same. More particularly, the present application relates to an interconnect structure containing conductive features having dimensions that are less than 50 nm and a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

There are two common methods of forming interconnect structures. The first known method of forming interconnect structures is referred to in the art as a subtractive process. In the subtractive process, a layer of metal is provided on a substrate and then the layer of metal is subjected to a patterning process which provides at least one metal portion from the layer of metal. A dielectric material is then provided and thereafter a planarization process may be performed to provide a completed interconnect structure to complete an interconnect structure.

The second known method of forming interconnect structures is referred to in the art as a damascene process. In a damascene process, a dielectric material is first provided on a substrate. At least one opening is then formed into the dielectric material by lithography and etching. Next, a conductive metal is deposited within the at least one opening and atop the dielectric material. A planarization process can follow the deposition of the conductive metal to complete an interconnect structure.

The aforementioned methods of forming interconnect structures are reaching their limits and there is thus a need for providing an alternative method of forming interconnect structures which is capable of providing conductive features that have a dimension that is less than 50 nm.

SUMMARY

In one aspect of the present application, a method of forming an interconnect structure having conductive features that have a dimension that is less than 50 nm is provided. In one embodiment of the present application, the method of the present application includes providing a dielectric material stack of, from bottom to top, a first dielectric material and a second dielectric material. Next, at least one opening having a width from 5 nm to 800 nm is formed within the second dielectric material. The at least one opening that is formed into the second dielectric material exposes a portion of an upper surface of the first dielectric material. A diffusion barrier portion is then provided on each sidewall surface of remaining portions of the second dielectric material within the at least one opening. A conductive metal portion is then laterally formed from a sidewall surface of each diffusion barrier portion in the at least one opening, wherein each conductive metal portion in each opening is separated by a gap. An undercut region is then formed in the first dielectric material and beneath each conductive metal portion. A metal liner is then provided on exposed sidewall surfaces and a bottom surface of each conductive metal portion.

In another aspect of the present application, an interconnect structure having conductive features that have a dimension of less than 50 nm is provided. The interconnect structure of the present application includes a first dielectric material having an undercut region located at an upper surface thereof. A first conductive structure is located above a first area of the undercut region. In accordance with the present application, the first conductive structure comprises a first conductive metal portion having a diffusion barrier portion located on one sidewall surface of the first conductive metal portion and having a metal liner located on another sidewall surface and a bottom surface of the first conductive metal portion. A second conductive structure is located above a second area of the undercut region. In accordance with the present application, the second conductive structure comprises a second conductive material portion having a diffusion barrier portion located on one sidewall surface of the second conductive material portion and having a metal liner located on another sidewall surface and a bottom surface of the second conductive metal portion. A gap is located between the first and second conductive structures. The gap may be filled with air or a dielectric material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
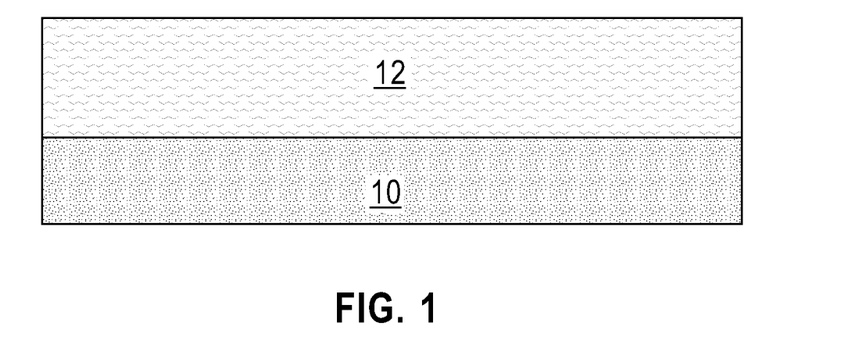
FIG. 1 is a cross sectional view of a first exemplary semiconductor structure including a stack of, from bottom to top, a first dielectric material and a second dielectric material in accordance with an embodiment of the present application.

Referring now to FIG. 1, there is illustrated a first exemplary semiconductor structure including a dielectric material stack of, from bottom to top, a first dielectric material 10 and a second dielectric material 12 in accordance with an embodiment of the present application. The dielectric material stack may be located on a surface of a substrate (not shown in the drawings of the present application).

The substrate, which is not shown, may comprise a semiconducting material, an insulating material, a conductive material or any combination thereof. When the substrate is comprised of a semiconducting material, any semiconducting material such as Si, SiGe, SiGeC, SiC, Ge alloys, III/V compound semiconductor or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

When the substrate is an insulating material, the insulating material can be an organic insulator, an inorganic insulator or a combination thereof including multilayers. When the substrate is a conductive material, the substrate may include, for example, polySi, a conductive metal, alloys of at least two conductive metals, a metal silicide, a metal nitride or combinations thereof including multilayers. When the substrate comprises a combination of an insulating material and a conductive material, the substrate may represent a first interconnect level of a multilayered interconnect structure, and the dielectric material stack shown in FIG. 1, may provide components of a second interconnect level of the multilayered interconnect structure.

As stated above, the dielectric material stack that is shown in FIG. 1 includes a first dielectric material 10 and a second dielectric material 12. In accordance with the present application, the first dielectric material 10 and the second dielectric material 12 of the dielectric material stack shown in FIG. 1 comprise different dielectric materials such that an etch selectively is provided between the first and second dielectric materials 10, 12. As such, the first dielectric material 10 can be used in the present application as an etch stop layer during the subsequent patterning of the second dielectric material 12.

The first dielectric material 10 may include a dielectric oxide, dielectric nitride and/or dielectric oxynitride. In one embodiment, the first dielectric material 10 includes silicon dioxide. In another embodiment, the first dielectric material 10 may include silicon nitride. In yet another embodiment, the first dielectric material 10 may include a multilayered stack, in any order, of silicon dioxide and silicon nitride.

The second dielectric material 12 may include any inter-level or intralevel dielectric including inorganic dielectrics or organic dielectrics. Some examples of suitable dielectrics that can be used as the second dielectric material 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the second dielectric material 12 is employed as a permanent member in which at least some portions of the second dielectric material 12 remain in the final interconnect structure of the present application. In another embodiment, the second dielectric material 12 is employed as a sacrificial material in which all portions of the second dielectric material 12 can be removed and, in some embodiments, can be replaced with another dielectric material that will be present in the final interconnect structure of the present application.

In one embodiment, the first dielectric material 10 and/or the second dielectric material 12 may be non-porous. In another embodiment, the first dielectric material 10 and/or the second dielectric material 12 may be porous. Porous dielectrics are advantageous since such dielectric materials have lower dielectric constants than an equivalent non-porous dielectric material.

In one embodiment, the second dielectric material 12 of the dielectric material stack shown in FIG. 1 has a dielectric constant that is about 4.0 or less. In another embodiment, the second dielectric material 12 of the dielectric material stack shown in FIG. 1 has a dielectric constant of about 2.8 or less. All dielectric constants mentioned herein are relative to a vacuum, unless otherwise noted. The second dielectric material 12 of the dielectric material stack shown in FIG. 1 that is employed in the present application generally has a lower parasitic crosstalk as compared with dielectric materials that have a dielectric constant of greater than 4.0.

In the present application, the first dielectric material 10 of the dielectric material stack shown in FIG. 1 has a first thickness, while the second dielectric material 12 of the dielectric material stack shown in FIG. 1 has a second thickness that is greater than the first thickness of the first dielectric material 10. In one embodiment, the first thickness of the first dielectric material 10 is from 10 nm to 40 nm, and the second thickness of the second dielectric material 12 is from 50 nm to 1000 nm.

The first and second dielectric materials 10 and 12 can be formed utilizing a deposition process such as, for example, chemical vapor deposition, plasma enhanced chemical vapor deposition, spin-on coating, evaporation or chemical solution deposition. In some embodiments of the present application, a thermal process such as, for example, thermal oxidation and/or thermal nitridation can be used in forming the first dielectric material 10, while one of the above mentioned deposition processes can be used in forming the second dielectric material 12. In one embodiment, and the first and second dielectric materials 10, 12 can be formed by a same deposition process. In another embodiment, the first and second dielectric materials 10, 12 can be formed by a different deposition process.

Figure 2:
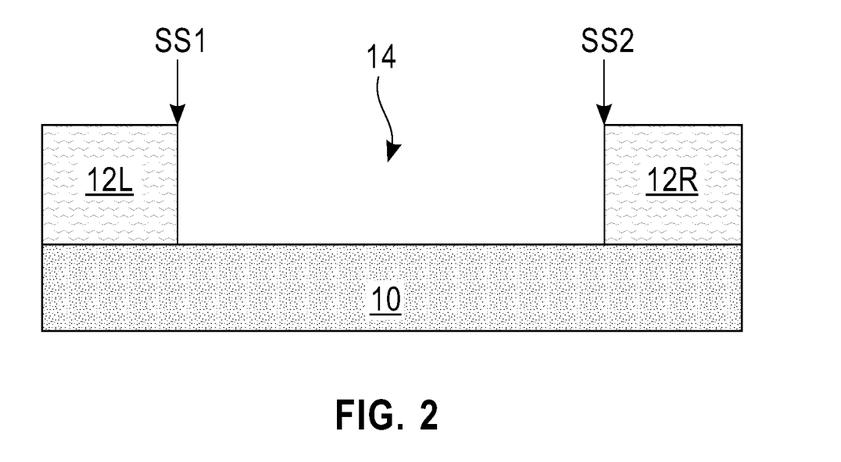
FIG. 2 is a cross sectional view of the first exemplary semiconductor of FIG. 1 after forming at least one opening within the second dielectric material.

Referring now to FIG. 2, there is illustrated the first exemplary semiconductor of FIG. 1 after forming at least one opening 14 into the second dielectric material 12. Although a single opening 14 is illustrated as being formed into the second dielectric material 12, a plurality of such openings can be formed into the second dielectric material 12. Each opening 14 exposes a sidewall surface SS1, SS2 of remaining portions of the second dielectric material. Also, each opening 14 exposes a portion of an upper surface of the first dielectric material 10. The remaining portions of the second dielectric material that are formed after forming the at least one opening 14 are referred to herein as second dielectric material portions 12L, 12R.

In accordance with the present application, each opening 14 that is formed has a width that is at least three times greater than the normal width of an opening formed into an interconnect dielectric material utilizing a damascene process. In one embodiment, each opening 14 that is formed has a width from 5 nm to 800 nm. In another embodiment, each opening 14 that is formed has a width from 10 nm to 200 nm.

Each opening 14 can be formed into the second dielectric material 12 utilizing lithography and etching; due to having different compositions the first dielectric material 10 serves as an etch stop layer during the etching process. The lithographic process can include forming a photoresist (not shown) on an exposed upper surface of the second dielectric material 12, exposing the photoresist to a desired pattern of radiation and developing the exposed photoresist utilizing a conventional resist developer. The pattern is then transferred into the underlying second dielectric material 12 by etching. The etching can include a dry etching process (such as, for example, reactive ion etching, ion beam etching, plasma etching or laser ablation), and/or a wet chemical etching process. Typically, reactive ion etching is used in providing the at least one opening 14. After patterning the second dielectric material 12, the patterned photoresist can be removed utilizing a conventional stripping process such as, for example, ashing.

In one embodiment and prior to patterning the second dielectric material 12, a hard mask (not shown) can be formed directly on an exposed upper surface of the second dielectric material 12. When employed, the hard mask can include an oxide, a nitride, an oxynitride or any multilayered combination thereof. In one embodiment, the hard mask is composed of an oxide such as silicon dioxide, while in another embodiment the hard mask is composed of a nitride such as silicon nitride. The hard mask can be formed utilizing a deposition process including, for example, chemical vapor deposition (CVD), plasma enhanced chemical vapor deposition (PECVD), chemical solution deposition, evaporation, or physical vapor deposition (PVD). Alternatively, the hard mask can be formed by one of thermal oxidation, and thermal nitridation. When employed, the thickness of the hard mask is from 5 nm to 100 nm. Other thicknesses that are greater than or lesser than the thickness range mentioned above can also be employed for the hard mask.

When a hard mask is present, a first etch is performed to transfer the pattern provided in the photoresist to the hard mask, the patterned photoresist can then removed by an ashing step, and thereafter, a second etch is performed to transfer the pattern from the patterned hard mask into the second dielectric material 12. In embodiments in which a hard mask is present, the hard mask can be removed from atop the second dielectric material 12 after the at least opening 14 is formed into the second dielectric material 12. In such an embodiment, a planarization process such as, for example, chemical mechanical polishing and/or grinding can be used to remove remaining portions of hard mask from atop the second dielectric material 12.

In some embodiments of the present application, the width of each opening 14, as measured from one sidewall surface (e.g., SS1) of one second dielectric material portion (i.e., 12L) to a sidewall surface (e.g., SS2) of a neighboring second dielectric material portion (i.e., 12R), may be the same. In other embodiments of the present application, the width of each opening 14, as measured from one sidewall surface (e.g., SS1) of one second dielectric material portion (i.e., 12L) to a sidewall surface (e.g., SS2) of a neighboring second dielectric material portion (i.e., 12R), may be different. In yet other embodiments of the present application, the width of a first set of openings, as measured from one sidewall surface of one second dielectric material portion to a sidewall surface of a neighboring second dielectric material portion, may be the same, while the width of a second set of openings, as measured from one sidewall surface of one second dielectric material portion to a sidewall surface of a neighboring second dielectric material portion may be different.

Figure 3:
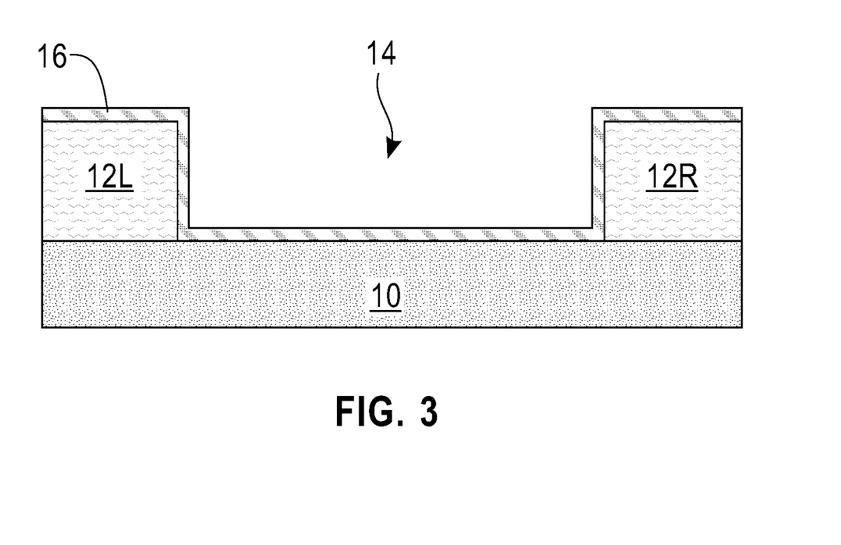
FIG. 3 is a cross sectional view of the first exemplary semiconductor structure of FIG. 2 after forming a layer of diffusion barrier material on all exposed surfaces of remaining portions of the second dielectric material and on an exposed upper surface of the first dielectric material.

Referring now to FIG. 3, there is illustrated the first exemplary semiconductor structure of FIG. 2 after forming a layer of diffusion barrier material 16 on exposed surfaces of the remaining portions of the second dielectric material 12L, 12R and on an exposed upper surface of the first dielectric material 10. That is, a contiguous layer of a diffusion barrier material 16 is formed on the exposed upper surface of each second dielectric material portion 12L, 12R, on exposed sidewall surfaces (SS1, SS2) of each second dielectric material portion 12L, 12R within each opening 14 and along the exposed upper surface of the first dielectric material 10 provided by each opening 14.

The terms "contiguously" or "contiguous" denotes that a particular layer such as, for example, the layer of diffusion barrier material 16, does not include any breaks therein. The layer of diffusion barrier material 16 does not completely fill each opening 14, but rather the layer of diffusion barrier material 16 is present along the sidewall surfaces of each remaining second dielectric material portion 12L, 12R (i.e., SS1, SS2) and the exposed upper surface of the first dielectric material 10 provided by each opening 14.

The layer of diffusion barrier material 16 can include Co, CoN, Ir, Pt, Pd, Ta, TaN, Ti, TiN, Ru, RuN, RuTa, RuTaN, W, WN or any other material that can serve as a barrier to prevent a conductive material from diffusing there through. The thickness of the layer of diffusion barrier material 16 may vary depending on the deposition process used as well as the material employed. In one example, the layer of diffusion barrier material 16 may have a thickness from 1 nm to 50 nm. In another example, the layer of diffusion barrier material 16 may have a thickness from 5 nm to 20 nm.

The layer of diffusion barrier material 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
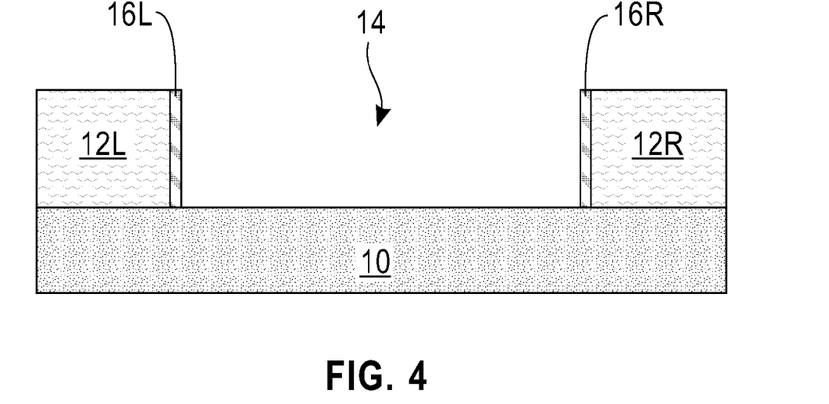
FIG. 4 is a cross sectional view of the first exemplary semiconductor structure of FIG. 3 after removing portions of the layer of diffusion barrier material from all horizontal surfaces of the second dielectric material and a portion of the first dielectric material, while maintaining a diffusion barrier portion on exposed sidewall surfaces of each remaining second dielectric material portion and in the at least one opening.

Referring now to FIG. 4, there is illustrated the first exemplary semiconductor structure of FIG. 3 after removing portions of the layer of diffusion barrier material 16 from horizontal surfaces of each second dielectric material portion 12L, 12R and from a portion of the exposed upper surface of the first dielectric material 10, while maintaining a diffusion barrier portion 16L, 16R on each exposed sidewall surface of each second dielectric material portion 12L, 12R in the at least one opening 14. As is shown, the upper surface of each diffusion barrier portion 16L, 16R that is provided is coplanar with an upper surface of each second dielectric material portion 12L, 12R.

The structure shown in FIG. 4 can be formed by subjecting the structure shown in FIG. 3 to a directional etching process which removes a selected material, i.e., the diffusion barrier material, from all horizontal surfaces of a structure, while maintaining a portion of the selected material, i.e., the diffusion barrier material, on all vertical surfaces of the structure. In one embodiment of the present application, the directional etching process that can be used in providing the structure shown in FIG. 4 includes a sputter etching process. In one example, sputter etching can be performed utilizing an argon plasma.

Figure 5:
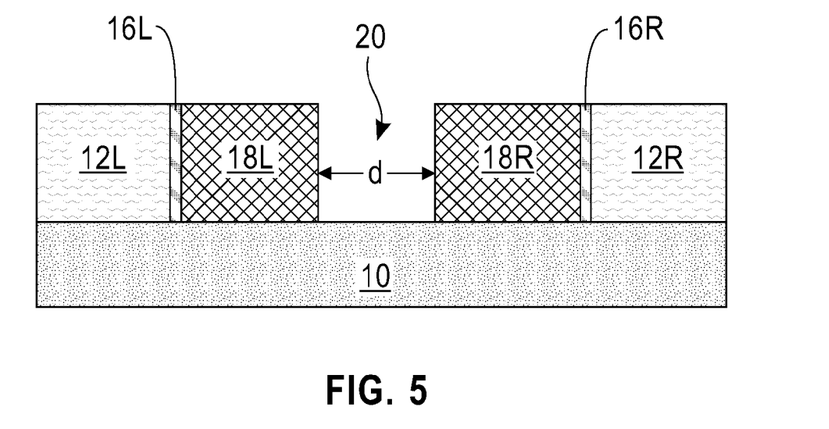
FIG. 5 is a cross sectional view of the first exemplary semiconductor structure of FIG. 4 after selectively forming a conductive metal portion on each sidewall surface of each diffusion barrier portion and within the at least one opening, wherein a gap is present in the at least one opening and located between each conductive metal portion.

Referring now to FIG. 5, there is illustrated the first exemplary semiconductor structure of FIG. 4 after selectively forming a conductive metal portion 18L, 18R (i.e., conductive feature) on each sidewall surface of each diffusion barrier portion 16L, 16R within the at least one opening 14, wherein a gap 20 is present in the at least one opening 14 and located between each conductive metal portion 18L, 18R. As shown, a pair of conductive metal portions 18L, 18R is formed into each opening 14.

As shown in FIG. 5, a bottom surface of each conductive metal portion 18L, 18R within each opening 14 is in direct contact with a portion of the exposed upper surface of the first dielectric material 10. As is also shown in FIG. 5, each conductive metal portion 18L, 18R has an upper surface that is coplanar with an upper surface of each diffusion barrier material portion 16L, 16R and an upper surface of each second dielectric material portion 12L, 12R. As is further shown in FIG. 5, a portion of the exposed upper surface of the first dielectric material 10 remains bare after forming the conductive metal portions 18L, 18R into each opening 14.

Each conductive metal portion 18L, 18R that is formed can include any metal or metal alloy that can be employed as a conductive material within an interconnect structure. Examples of such metals or metal alloys that can be used as the material of each conductive metal portion 18L, 18R include, but are not limited to, Cu, W, Al, Ru, Co or alloys thereof. In another example, a Co(W, P, B) alloy can be used as a material for each conductive metal portion 18L, 18R. In some embodiments, each conductive metal portion 18L, 18R may comprise a single layer of metal or metal alloy. In other embodiments, each conductive metal portion 18L, 18R may comprise a plurality of vertically orientated metal or metal alloy layers. In some cases, Cu is selected as the material for each conductive metal portion 18L, 18R.

In accordance with the present application, each conductive metal portion 18L, 18R (i.e., conductive feature) has a nanoscale dimension. By "nanoscale dimension" it is meant that each conductive metal portion 18L, 18R has a width that is less than the lithographic limit of conventional lithography which as of the filing date of the present application is 50 nm. In one embodiment, each conductive metal portion 18L, 18R has a width that is less than 30 nm. In one another embodiment, each conductive metal portion 18L, 18R has a width of from 10 nm to 25 nm.

In some embodiments, a block mask may be used to protect a first set of openings, while leaving a second set of openings unprotected. A pair of conductive metal portions, each comprising a first metal or metal alloy, may be formed into the second set of openings. The block mask can then be removed from the first set of openings, and then another block mask is formed over the areas including the second set of openings. A pair of conductive metal portions, each comprising a second metal or metal alloy which differs from the first metal or metal alloy, may be formed into the first set of openings and thereafter the another block mask can be removed. The usage of block mask technology thus permits the formation of conductive metal portions within one set of openings that comprise a different metal or metal alloy than conductive metal portions that are formed within a second set of openings. For example, the conductive metal portions in one opening may comprise W, while the conductive metal portions in another opening may comprise Cu.

The pair of conductive metal portions 18L, 18R that is provided into each opening 14 can be formed by a selective deposition process in which the metal or metal alloy used in providing each conductive metal portions 18L, 18R grows laterally from the sidewall surfaces of each diffusion barrier material portion 16L, 16R within each opening 14. Examples of selective deposition processes that can be used in forming the conductive metal portions 18L, 18R include, but are not limited to, CVD, PECVD, ALD or electroless deposition.

In some embodiments, the conductive metal portions 18L, 18R can be formed utilizing a low temperature chemical deposition process including, for example, CVD, PECVD, low pressure (i.e., a pressure of 20 torr or less) CVD, ALD or electroless deposition. By "low temperature", it is meant a deposition temperature of from 75° C. up to, and including, 200° C. In some embodiments, the low temperature deposition conditions are selected to provide a deposition rate of the metal spacers onto the sidewall surface of the diffusion barrier material portions 16L, 16R that is from 0.2 Å/sec to 0.8 Å/sec.

Figure 6:
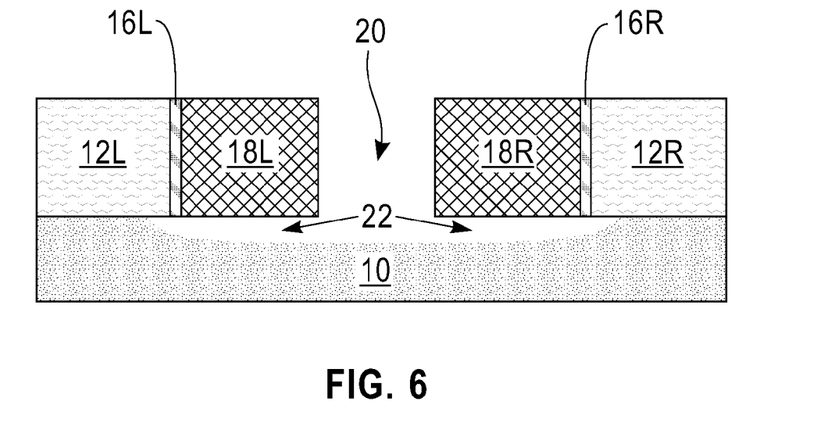
FIG. 6 is a cross sectional view of the first exemplary semiconductor structure of FIG. 5 after forming an undercut region beneath each conductive metal portion and within the first dielectric material.

Referring now to FIG. 6, there is illustrated the first exemplary semiconductor structure of FIG. 5 after forming an undercut region 22 beneath each conductive metal portion 18L, 18R and within the first dielectric material 10. In some embodiments, and as shown, the undercut region 22 extends beneath a portion of each second dielectric material portion 12L, 12R. The undercut region 22 is formed utilizing a chemical wet etching process that selectively removes the dielectric material of the first dielectric material 10 relative to the second dielectric material portions 12L, 12R, the diffusion barrier portions 16L, 16R and the conductive metal portions 18L, 18R. In one embodiment of the present application, a dilute HF solution can be used as a chemical etching in forming the undercut region 22. This step provides a undercut region 22 within the upper surface of the first dielectric material 10.

Figure 7:
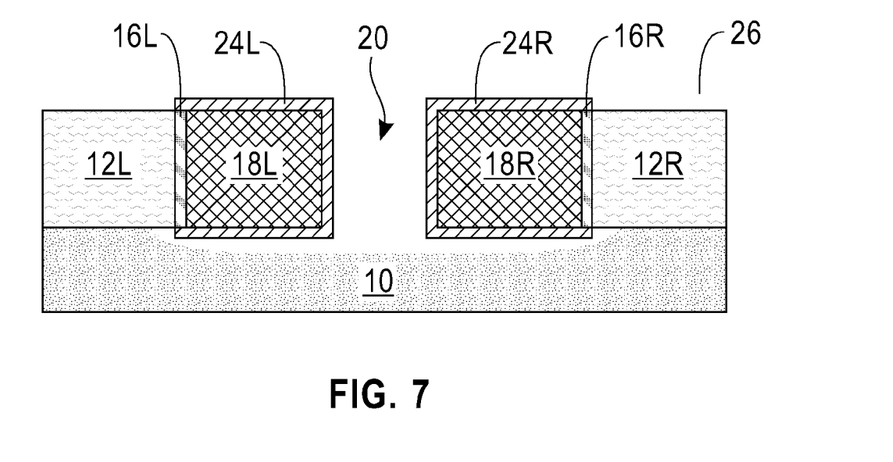
FIG. 7 is a cross sectional view of the first exemplary semiconductor structure of FIG. 6 after forming a metal liner on exposed surfaces of each conductive metal portion.

Referring now to FIG. 7, there is illustrated the first exemplary semiconductor structure of FIG. 6 after forming a metal liner 24L, 24R on exposed surfaces of each conductive metal portion 18L, 18R. As is shown in the drawing, a metal liner 24L, 24R is located on an upper surface, sidewall surface, and a bottom surface of each conductive metal portion 18L, 18L. As is also shown in FIG. 7, the metal liner 24L, 24R and the diffusion barrier portion 16L, 16R are contiguously present around each conductive metal portion 18L, 18L.

In one embodiment of the present application, the metal liner 24L, 24R includes a same material as that of the diffusion barrier portion 16L, 16R. In another embodiment of the present application, the metal liner 24L, 24R includes a different material than the diffusion barrier portion 16L, 16R. In either embodiment, the metal liner 24, 24R may include Co, CoN, Ir, Pt, Pd, Ta, TaN, Ti, TiN, Ru, RuN, RuTa, RuTaN, W, WN or any other material that can serve as a barrier to prevent a conductive material from diffusing there through.

The thickness of the metal liner 24L, 24R may be the same or different from that of the diffusion barrier portions 16L, 16R. In one embodiment, the metal liner 24L, 24R has a thickness from 1 nm to 50 nm. In another embodiment, the metal liner 24L, 24R may have a thickness from 5 nm to 20 nm.

The metal liner 24L, 24R can be formed by a deposition process including, for example, chemical vapor deposition (CVD), plasma enhanced chemical vapor deposition (PECVD), or atomic layer deposition (ALD).

Figure 8:
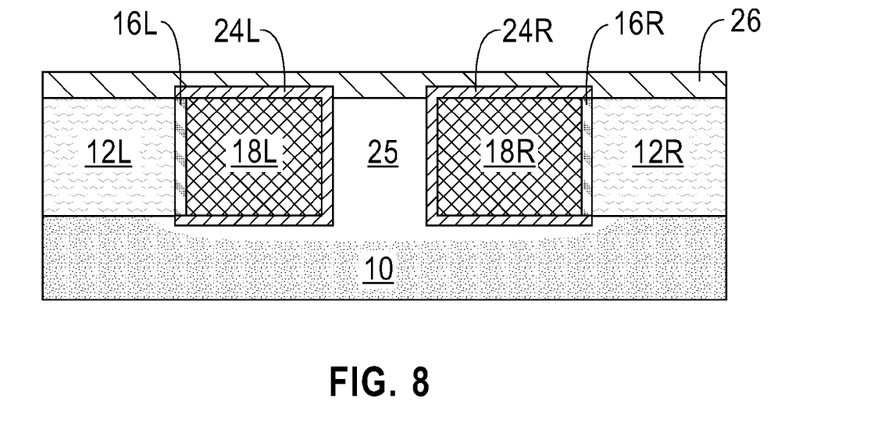
FIG. 8 is a cross sectional view of the first exemplary semiconductor structure of FIG. 7 after forming a cap layer on the surface of the structure in accordance with an embodiment of the present application.

Referring now to FIG. 8, there is illustrated the first exemplary semiconductor structure of FIG. 7 after forming a cap layer 26 on the surface of the structure in accordance with an embodiment of the present application. In this embodiment, the cap layer 26 seals gap 20 and undercut region 22 forming an air gap 25 consisting of the gap 20 and the undercut region 22. The air gap 25 may be filled with air. As shown, the cap layer 26 is formed on exposed upper surfaces of each second dielectric material portion 12L, 12R, each diffusion barrier portion 16L, 16R, each metal liner 24L, 24R, and atop the gap 20. In some embodiments (not shown), a portion of each metal liner 24L, 24R can be removed from the upper surface of each conductive metal portion 18L, 18R prior to forming the cap layer 26.

Cap layer 26 may include a dielectric material such as, for example, silicon nitride, silicon dioxide, silicon carbide, a carbon doped oxide, a nitrogen and hydrogen doped silicon carbide, i.e., SiC(N,H), $Si_4NH_3$ or multilayered thereof. The cap layer 26 can be formed by a deposition process including, for example, chemical vapor deposition, plasma enhanced chemical vapor deposition or spin-on coating. The thickness of the cap layer 26 can be from 20 nm to 75 nm. Although thicknesses that are lesser than or greater than the thickness range mentioned above can also be used in the present application for cap layer 26.

FIG. 8 illustrates one possible interconnect structure of the present application. The interconnect structure shown in FIG. 8 includes a first dielectric material 10 having an undercut region 22 located at an upper surface thereof. A first conductive structure is located above a first area of the undercut region 22. In accordance with the present application, the first conductive structure comprises a first conductive metal portion 18L having a diffusion barrier portion 16L located on one sidewall surface of the first conductive metal portion 18L and having a metal liner 24L located on another sidewall surface and a bottom surface of the first conductive metal portion 18L. A second conductive structure is located above a second area of the undercut region 22. In accordance with the present application, the second conductive structure comprises a second conductive material portion 18R having a diffusion barrier portion 16R located on one sidewall surface of the second conductive material portion 18R and having a metal liner 24R located on another sidewall surface and a bottom surface of the second conductive metal portion 18R. A gap 20 is located between the first and second conductive structures. In this embodiment, gap 20 (and the undercut region 22) is filled with air, i.e., air gap 25 is present.

Figure 9:
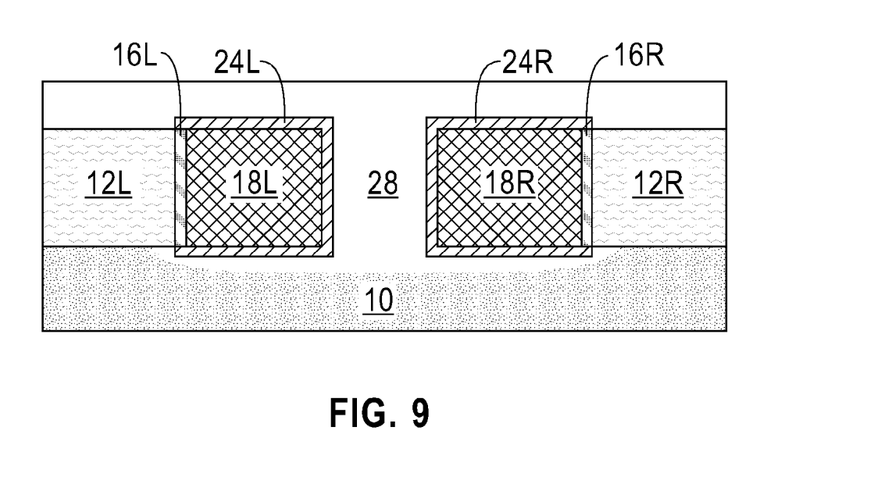
FIG. 9 is a cross sectional view of the first exemplary semiconductor structure of FIG. 7 after forming a third dielectric material within the undercut region and the gap in accordance with another embodiment of the present application.

Referring now to FIG. 9, there is illustrated the first exemplary semiconductor structure of FIG. 7 after forming a third dielectric material 28 within the undercut region 22 and the gap 20 in accordance with another embodiment of the present application. As shown in the drawings, the third dielectric material 28 completely fills the undercut region 22 and the gap 20 and extends atop the upper surface of metal liner 28L, 28R and the second dielectric material portions 12L, 12R.

In one embodiment of the present application, the third dielectric material 28 may comprise a same dielectric material of the second dielectric material 12. In another embodiment, the third dielectric material 28 may include a different dielectric material as the dielectric material used in providing the second dielectric material 12. Notwithstanding which embodiment is employed, the third dielectric material 28 may include any interlevel or intralevel dielectric including inorganic dielectrics or organic dielectrics. Some examples of suitable dielectrics that can be used as the third dielectric material 28 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the third dielectric material 28 may be non-porous. In another embodiment, the third dielectric material 28 may be porous. Porous dielectrics are advantageous since such dielectric materials have lower dielectric constants than an equivalent non-porous dielectric material.

In one embodiment, the third dielectric material 28 has a dielectric constant that is about 4.0 or less. In another embodiment, the third dielectric material 28 has a dielectric constant of about 2.8 or less. All dielectric constants mentioned herein are relative to a vacuum, unless otherwise noted. The third dielectric material 28 that is employed in the present application generally has a lower parasitic crosstalk as compared with dielectric materials that have a dielectric constant of greater than 4.0.

The third dielectric material 28 can be formed utilizing a deposition process such as, for example, chemical vapor deposition, plasma enhanced chemical vapor deposition, spin-on coating, evaporation or chemical solution deposition.

Figure 10:
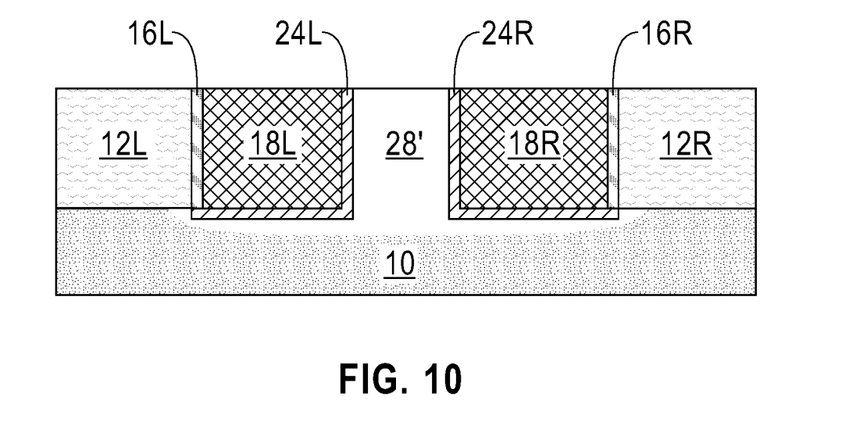
FIG. 10 is a cross sectional view of the first exemplary semiconductor structure of FIG. 9 after performing a planarization process.

Referring now to FIG. 10, there is illustrated the first exemplary semiconductor structure of FIG. 9 after performing a planarization process which removes excess third dielectric material 28 from the structure. In some embodiments (and as shown in FIG. 10), the planarization process can also remove a portion of the metal liner 28L, 28R that is located on the upper horizontal surface of each conductive metal portion 18L, 18R from the structure. In such a structure, the remaining third dielectric material (labeled as 28' in FIG. 10) has an upper surface the is coplanar with an upper surface of each conductive metal portion 18L, 18R, an upper surface of each diffusion barrier portion 16L, 16R and an upper surface of each second dielectric material portion 12L, 12R. In other embodiments (not shown), the planarization process may maintain the portion of the metal liner 28L, 28R that is located on the upper horizontal surface of each conductive metal portion 18L, 18R in the structure. In some embodiments, the planarization process may include chemical mechanical planarization and/or grinding. In other embodiments, an etching process can be used to provide the planar structure shown in FIG. 10.

FIG. 10 illustrates another possible interconnect structure of the present application. The interconnect structure shown in FIG. 10 includes a first dielectric material 10 having an undercut region 22 located at an upper surface thereof. A first conductive structure is located above a first area of the undercut region 22. In accordance with the present application, the first conductive structure comprises a first conductive metal portion 18L having a diffusion barrier portion 16L located on one sidewall surface of the first conductive metal portion 18L and having a metal liner 24L located on another sidewall surface and a bottom surface of the first conductive metal portion 18L. A second conductive structure is located above a second area of the undercut region 22. In accordance with the present application, the second conductive structure comprises a second conductive material portion 18R having a diffusion barrier portion 16R located on one sidewall surface of the second conductive material portion 18R and having a metal liner 24R located on another sidewall surface and a bottom surface of the second conductive metal portion 18R. A gap 20 is located between the first and second conductive structures. In this embodiment, gap 20 (and the undercut region 22) is filled with the remaining portion of the third dielectric material 28'.

In some embodiments (not shown), the second dielectric material portions 12L, 12R may be removed and a cap layer, as mentioned above in connection with providing the structure shown in FIG. 8, can be formed providing an air gap within the structure. The second dielectric material portions 12L, 12R can be removed utilizing an etching process that selectively removes the dielectric material of the second dielectric material portions 12L, 12R. In one example, a fluorine based etchant can be used to remove the second dielectric material portions 12L, 12R from the structure.

Figure 11:
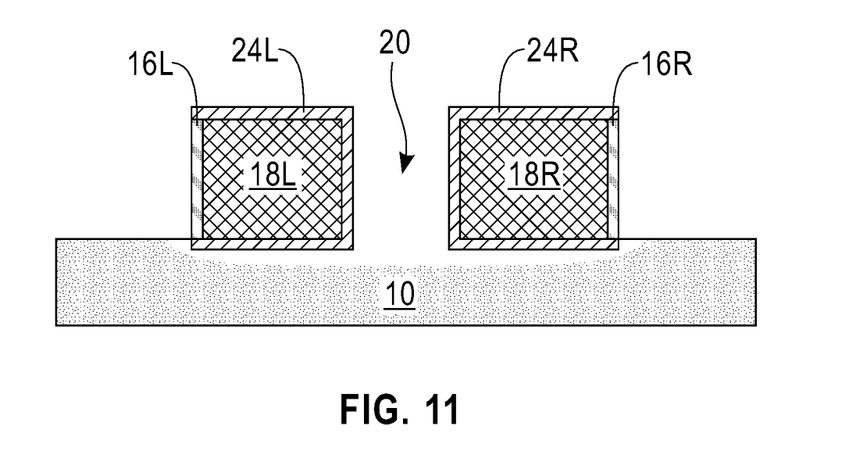
FIG. 11 is a cross sectional view of the first exemplary semiconductor structure of FIG. 7 after removing the remaining portions of the second dielectric material in accordance with a further embodiment of the present application.

Referring now to FIG. 11, there is illustrated the first exemplary semiconductor structure of FIG. 7 after removing the second dielectric material portions 12L, 12R in accordance with a further embodiment of the present application. Each second dielectric material portion 12L, 12R can be removed utilizing an etching process that selectively removes the dielectric material of the second dielectric material portions 12L, 12R. In one example, a fluorine based etchant can be used to remove the second dielectric material portions 12L, 12R from the structure. In some embodiments (not shown), a cap layer, as mentioned above in connection with providing the structure shown in FIG. 8, can be formed providing air gap within the structure.

Figure 12:
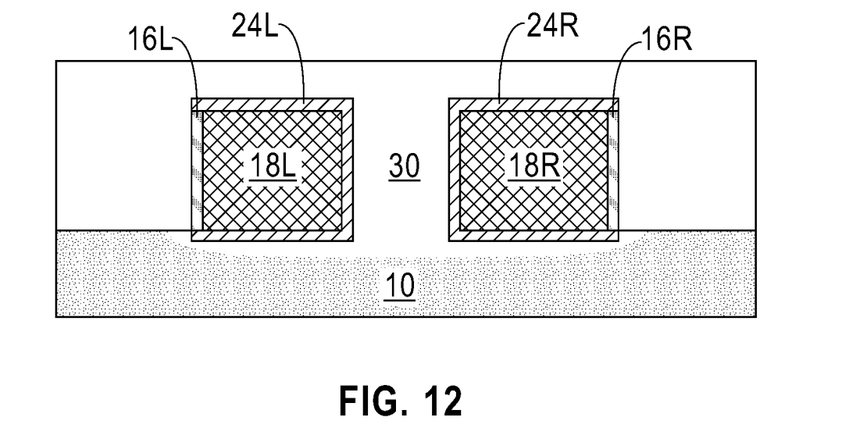
FIG. 12 is a cross sectional view of the first exemplary semiconductor structure of FIG. 11 after forming a fourth dielectric material.

Referring now to FIG. 12, there is illustrated the first exemplary semiconductor structure of FIG. 11 after forming a fourth dielectric material 30. The fourth dielectric material 30 may comprise one of the dielectric mentioned above for the second dielectric material 12. The fourth dielectric material 30 may be formed utilizing one of the deposition processes mentioned above in forming the second dielectric material 12.

Figure 13:
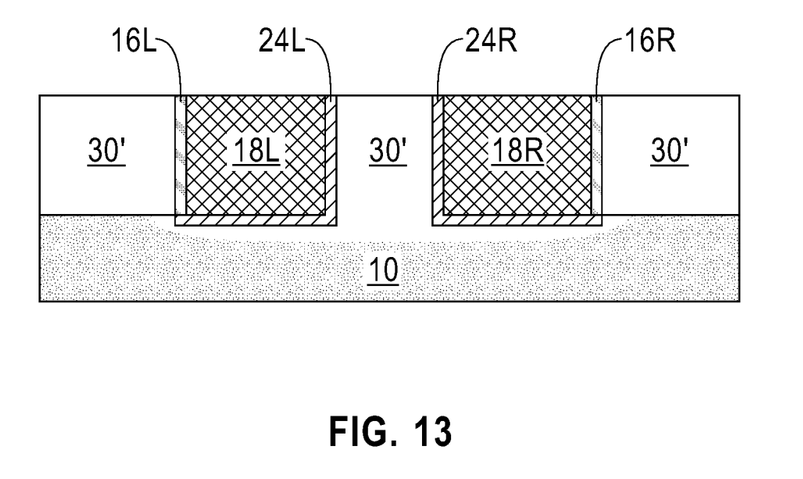
FIG. 13 is a cross sectional view of the first exemplary semiconductor structure of FIG. 12 after performing a planarization process.

Referring now to FIG. 13, there is illustrated the first exemplary semiconductor structure of FIG. 12 after performing a planarization process which removes excess fourth dielectric material 40 from the structure. In some embodiments (and as shown in FIG. 13), the planarization process can also remove a portion of the metal liner 28L, 28R that is located on the upper horizontal surface of each conductive metal portion 18L, 18R from the structure. In such a structure, the remaining fourth dielectric material (labeled as 30' in FIG. 13) has an upper surface the is coplanar with an upper surface of each conductive metal portion 18L, 18R, an upper surface of each diffusion barrier portion 16L, 16R and an upper surface of each second dielectric material portion 12L, 12R. In other embodiments (not shown), the planarization process may maintain the portion of the metal liner 28L, 28R that is located on the upper horizontal surface of each conductive metal portion 18L, 18R from the structure. In some embodiments, the planarization process may include chemical mechanical planarization and/or grinding. In other embodiments, an etching process can be used to provide the planar structure shown in FIG. 13.

FIG. 13 illustrates a yet other possible interconnect structure of the present application. The interconnect structure shown in FIG. 13 includes a first dielectric material 10 having an undercut region 22 located at an upper surface thereof. A first conductive structure is located above a first area of the undercut region 22. In accordance with the present application, the first conductive structure comprises a first conductive metal portion 18L having a diffusion barrier portion 16L located on one sidewall surface of the first conductive metal portion 18L and having a metal liner 24L located on another sidewall surface and a bottom surface of the first conductive metal portion 18L. A second conductive structure is located above a second area of the undercut region 22. In accordance with the present application, the second conductive structure comprises a second conductive material portion 18R having a diffusion barrier portion 16R located on one sidewall surface of the second conductive material portion 18R and having a metal liner 24R located on another sidewall surface and a bottom surface of the second conductive metal portion 18R. A gap 20 is located between the first and second conductive structures. In this embodiment, gap 20 (and the undercut region 22) is filled with the remaining fourth dielectric material 30'.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
   a first dielectric material having an undercut region located at an upper surface thereof;
   a first conductive structure located above a first area of said undercut region, wherein said first conductive structure comprises a first conductive metal portion having a diffusion barrier portion located on one sidewall surface of said first conductive metal portion and having a metal liner located on another sidewall surface and an entire bottom surface of said first conductive metal portion, wherein said first area of said undercut region extends entirely beneath said bottom surface of said first conductive structure and wherein said metal liner located on said entire bottom surface of said first conductive metal portion extends into said first area of said undercut region and is located beneath a topmost surface of said first dielectric material;
   a second conductive structure located above a second area of said undercut region, wherein said second conductive structure comprises a second conductive material portion having a diffusion barrier portion located on one sidewall surface of said second conductive material portion and having a metal liner located on another sidewall surface and an entire bottom surface of said second conductive metal portion, wherein said second area of said undercut region extends entirely beneath said bottom surface of said second conductive structure and wherein said metal liner located on said entire bottom surface of said second conductive metal portion extends into said second area of said undercut region and is located beneath said topmost surface of said first dielectric material; and
   a gap located between said first conductive structure and said second conductive structure.

2. The interconnect structure of claim 1, wherein said gap and said undercut region contain air, and wherein a cap layer is located atop an upper surface of said first conductive structure and said second conductive structure.

3. The interconnect structure of claim 1, wherein said gap and said undercut region contain another dielectric material.

4. The interconnect structure of claim 1, further comprising a second dielectric material portion located adjacent each sidewall surface of said first and second conductive structures containing said diffusion barrier portion, wherein each second dielectric material is present on a portion of said upper surface of said first dielectric material not including said undercut region.

5. The interconnect structure of claim 4, wherein said gap and said undercut region contain a third dielectric material.

6. The interconnect structure of claim 5, wherein an upper surface of said third dielectric material is coplanar with an upper surface of each second dielectric material portion, an upper surface of each diffusion barrier portion and an upper surface of said first and second conductive metal portions.

7. The interconnect structure of claim 1, wherein said diffusion barrier portion and said metal liner comprise a different material.

8. The interconnect structure of claim 1, wherein said diffusion barrier portion and said metal liner comprise a same material.

9. The interconnect structure of claim 1, wherein said first and second conductive metal portions comprises Cu, Al, W, Co or alloys thereof.

10. The interconnect structure of claim 1, wherein a topmost surface of said first conductive structure is coplanar with a topmost surface of said second conductive structure.

11. The interconnect structure of claim 4, wherein a topmost surface of each of said first conductive metal portion and said second conductive metal portion is coplanar with a topmost surface of said second dielectric material portion.

12. The interconnect structure of claim 11, wherein a topmost surface of each diffusion barrier portion is coplanar with said topmost surface of each of said first conductive metal portion, said second conductive metal portion and said second dielectric material portion.

13. The interconnect structure of claim 1, wherein a portion of said metal liner located on said another sidewall surface and said bottom surface of said first conductive metal portion further extends onto the topmost surface of said first conductive metal portion.

14. The interconnect structure of claim 13, wherein a portion of said metal liner located on said another sidewall surface and said bottom surface of said second conductive metal portion further extends onto the topmost surface of said second conductive metal portion.

15. The interconnect structure of claim 14, further comprising a cap layer atop said metal liner located on the topmost surface first and second conductive metal portions and extending across said gap.

* * * * *